United States Patent
Hattori et al.

(10) Patent No.: US 12,550,753 B2
(45) Date of Patent: Feb. 10, 2026

(54) SEMICONDUCTOR DEVICE INCLUDING A LEAD CONNECTOR HAVING A PLURALITY OF PROTRUDING PORTIONS

(71) Applicants: Kabushiki Kaisha Toshiba, Tokyo (JP); Toshiba Electronic Devices & Storage Corporation, Tokyo (JP)

(72) Inventors: Satoshi Hattori, Ibo Hyogo (JP); Kyo Tanabiki, Himeji Hyogo (JP); Atsushi Tanaka, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 335 days.

(21) Appl. No.: 18/113,123

(22) Filed: Feb. 23, 2023

(65) Prior Publication Data

US 2024/0079368 A1    Mar. 7, 2024

(30) Foreign Application Priority Data

Sep. 2, 2022    (JP) .................. 2022-140266

(51) Int. Cl.
*H01L 23/00*     (2006.01)
*H01L 23/31*     (2006.01)
*H01L 23/495*    (2006.01)

(52) U.S. Cl.
CPC .......... *H01L 24/40* (2013.01); *H01L 23/3107* (2013.01); *H01L 23/49517* (2013.01);
(Continued)

(58) Field of Classification Search
CPC ....... H01L 24/40; H01L 24/84; H01L 23/307; H01L 23/49524; H01L 23/49562;
(Continued)

(56) References Cited

U.S. PATENT DOCUMENTS

| 6,849,930 B2 | 2/2005 | Nakajima et al. |
| 8,299,600 B2 | 10/2012 | Sato et al. |

(Continued)

FOREIGN PATENT DOCUMENTS

| JP | 2002-151554 A | 5/2002 |
| JP | 2010-123686 A | 6/2010 |

(Continued)

OTHER PUBLICATIONS

Japanese Office Action mailed Oct. 24, 2025 in corresponding Japanese Patent Application 2022-140266 with English Translation, 6 pages.

*Primary Examiner* — Alonzo Chambliss
(74) *Attorney, Agent, or Firm* — Kim & Stewart LLP

(57) ABSTRACT

A device includes a first conductive-member which connects to a first electrode on a first face of a chip. A second conductive-member is spaced from the chip and the first conductive-member. A third conductive-member is spaced from the first and second conductive-members. A first connector connects between the second electrode and the second conductive-member. A second connector is opposed to a third electrode on the second face and connects the third electrode and the third conductive-member. A first connecting-member connects the first connector and the second face. A second connecting-member connects the first connector and the second conductive-member. The first connector includes first protruded portions protruded in a first direction from the first conductive-member to the second conductive-member. The second connecting-member is provided to correspond to each of places between the first protruded portions and the second conductive-member.

16 Claims, 7 Drawing Sheets

(52) U.S. Cl.
CPC .. *H01L 23/49524* (2013.01); *H01L 23/49541* (2013.01); *H01L 23/49562* (2013.01); *H01L 24/84* (2013.01); *H01L 2224/40245* (2013.01); *H01L 2224/84801* (2013.01); *H01L 2924/13055* (2013.01); *H01L 2924/13091* (2013.01)

(58) Field of Classification Search
CPC ......... H01L 23/49517; H01L 2924/181; H01L 23/49541
See application file for complete search history.

(56) References Cited

U.S. PATENT DOCUMENTS

| | | | |
|---|---|---|---|
| 8,624,379 B2 | 1/2014 | Nakamura | |
| 10,985,093 B2 | 4/2021 | Saito | |
| 11,037,863 B2 | 6/2021 | Kuraya et al. | |
| 11,735,505 B2* | 8/2023 | Kuraya | H01L 24/41 257/673 |
| 2009/0294934 A1 | 12/2009 | Shi et al. | |
| 2010/0072585 A1 | 3/2010 | Shi et al. | |
| 2013/0009295 A1* | 1/2013 | Otremba | H01L 24/83 257/676 |
| 2017/0069563 A1 | 3/2017 | Miyakawa | |
| 2017/0207150 A1* | 7/2017 | Choi | H01L 24/72 |
| 2018/0102308 A1 | 4/2018 | Nishiwaki et al. | |

FOREIGN PATENT DOCUMENTS

| | | | |
|---|---|---|---|
| JP | 2013074264 A | 4/2013 | |
| JP | 2017050489 A | 3/2017 | |
| JP | 2018-063993 A | 4/2018 | |
| JP | 2019-087657 A | 6/2019 | |
| JP | 2019087741 A | 6/2019 | |

* cited by examiner

SEMICONDUCTOR DEVICE INCLUDING A LEAD CONNECTOR HAVING A PLURALITY OF PROTRUDING PORTIONS

CROSS REFERENCE TO RELATED APPLICATIONS

This application is based upon and claims the benefit of priority from the prior Japanese Patent Application No. 2022-140266, filed on Sep. 2, 2022, the entire contents of which are incorporated herein by reference.

BACKGROUND

In a semiconductor assembly process, a semiconductor chip is joined between leads and connectors and electrodes are drawn from the front or back face of the semiconductor chip in some cases. In these cases, the semiconductor chip is connected to the leads and the connectors by reflowing of solder supplied between the leads and the semiconductor chip and between the semiconductor chip and the connectors.

However, there is a problem that the solder may move during the solder reflow process, which causes the semiconductor chip to be displaced from the leads or causes the connectors to be displaced from the semiconductor chip.

DETAILED DESCRIPTION

Figure 1A:
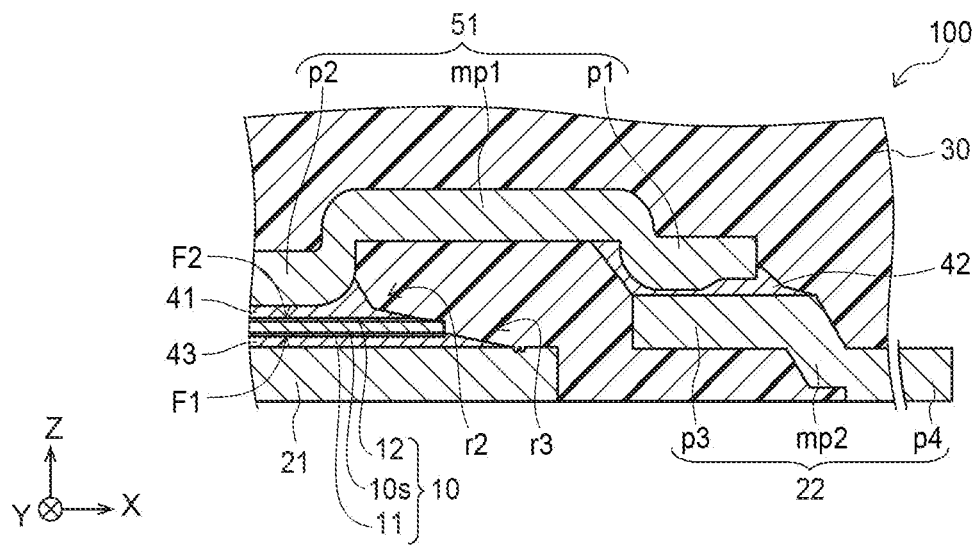
FIGS. 1A and 1B are sectional views illustrating a configuration example of a semiconductor device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor device according to the present embodiment comprises a semiconductor chip including a first face, and a second face on an opposite side to the first face. A first conductive member is opposed to a first electrode on the first face of the semiconductor chip and is electrically connected thereto. A second conductive member is spaced from the semiconductor chip and the first conductive member. A third conductive member is spaced from the semiconductor chip and the first and second conductive members. A first connector is opposed to a second electrode on the second face of the semiconductor chip and electrically connects the second electrode and the second conductive member to each other. A second connector is opposed to a third electrode on the second face of the semiconductor chip and electrically connects the third electrode and the third conductive member to each other. A first connecting member connects the first connector and the second face of the semiconductor chip to each other. A second connecting member connects the first connector and the second conductive member to each other. The first connector includes a plurality of first protruded portions protruded in a first direction from the first conductive member to the second conductive member. The second connecting member is provided to correspond to each of places between the first protruded portions and the second conductive member.

First Embodiment

Figure 1B:
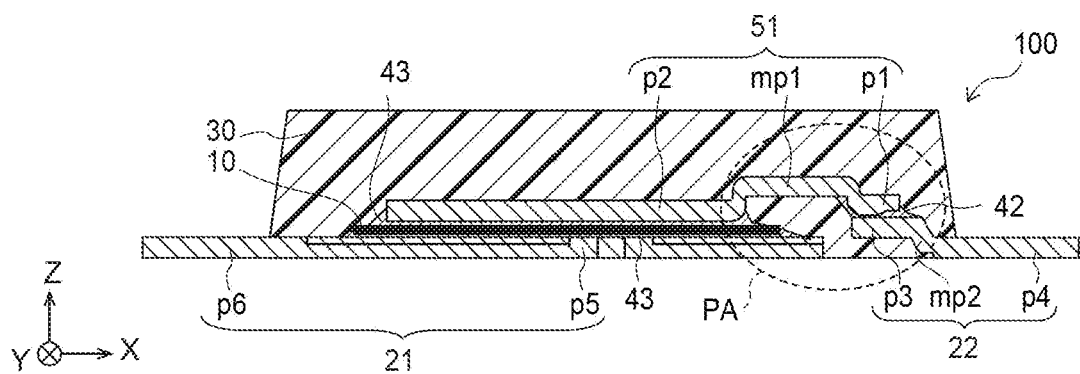
Figure 1C:
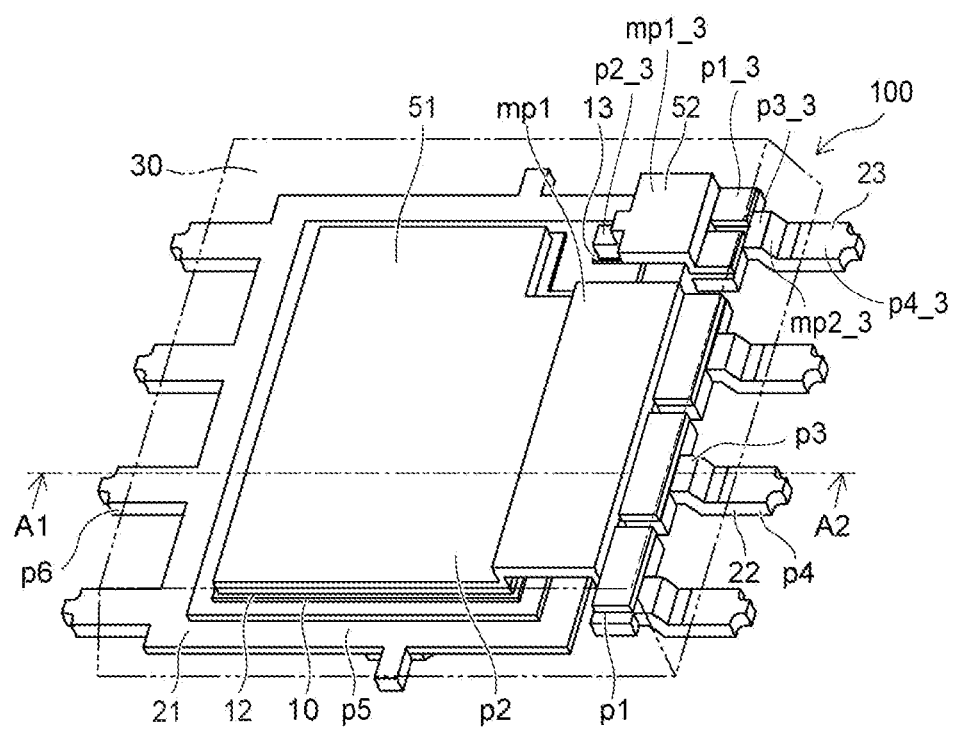
FIG. 1C is a perspective view illustrating the configuration example of the semiconductor device 100 according to the first embodiment.

FIGS. 1A and 1B are sectional views illustrating a configuration example of a semiconductor device 100 according to a first embodiment. FIG. 1C is a perspective view illustrating the configuration example of the semiconductor device 100 according to the first embodiment. FIG. 1B is a sectional view along a line A1-A2 in FIG. 1C.

The semiconductor device 100 according to the first embodiment includes a semiconductor chip 10, a first conductive member 21, a second conductive member 22, a third conductive member 23, a first connector 51, a second connector 52, connecting members 41 to 43, and a resin part 30.

The semiconductor chip 10 can be, for example, a bipolar transistor, a MOSFET (Metal Oxide Semiconductor Field Effect Transistor), or an IGBT (Insulated Gate Bipolar Transistor) that enables a large current to flow between a source and a drain on the basis of a gate voltage. As illustrated in FIG. 1A, the semiconductor chip 10 includes a first electrode 11 (for example, a drain electrode), a second electrode 12 (for example, a source electrode), a third electrode 13 (for example, a gate electrode), and a semiconductor layer 10s.

The semiconductor chip 10 includes a first face F1, and a second face F2 on an opposite side to the first face F1. The drain electrode 11 being the first electrode is provided on the first face F1 of the semiconductor chip 10, and the source electrode 12 being the second electrode and the gate electrode 13 being the third electrode are provided on the second face F2 of the semiconductor chip 10. The semiconductor layer 10s is provided between the drain electrode 11 and the source electrode 12.

The first conductive member 21 is a base region on which the semiconductor chip 10 is mounted, and is a portion of a lead frame. The first conductive member 21 is opposed to the drain electrode 11 on the first face F1 and is electrically connected thereto. For example, a conductive material such as copper is used as the first conductive member 21.

The first conductive member 21 includes a portion p5 and a portion p6 as illustrated in FIG. 1B. The portion p5 is the base region on which the semiconductor chip 10 is mounted and has a size same as or larger than the semiconductor chip 10. The portion p6 is protruded portions extending in a −X direction from the portion p5, is a lead region enabling connection to outside, and is molded as a plurality of protruded portions.

The connecting member 43 is provided between the semiconductor chip 10 and the first conductive member 21 as illustrated in FIG. 1A. The connecting member 43 fixes the semiconductor chip 10 to the first conductive member 21 and electrically connects the drain electrode 11 of the semiconductor chip 10 to the first conductive member 21. The connecting member 43 is made of, for example, a conductive material such as solder that is lower in the melting point than the semiconductor chip 10 and the first conductive member 21.

The second conductive member 22 is an outer lead spaced in an X direction from the semiconductor chip 10 and the first conductive member 21 and is a portion of the lead frame. The second conductive member 22 is opposed to the first connector 51 and is electrically connected to the first connector 51. For example, a conductive material such as copper is used as the second conductive member 22.

The connecting member 42 is provided between the second conductive member 22 and the first connector 51. The connecting member 42 fixes the first connector 51 to the second conductive member 22 and electrically connects the first connector 51 to the second conductive member 22. The connecting member 42 is made of a conductive material lower in the melting point than the semiconductor chip and the first conductive member 21 similarly to the connecting member 43. For example, a conductive material such as solder is used as the connecting member 42.

The second conductive member 22 includes third portions p3 and fourth portions p4. The third portions p3 are at a location higher in a Z direction than the fourth portions p4 and function as posts that connect with the first connector 51 via the connecting member 42. The fourth portions p4 extend substantially in an X-axis direction from the associated third portions p3 and serve as external terminals to be connected to outside, respectively. There is a middle portion mpg between each of the third portions p3 and the associated fourth portion p4. The middle portion mpg is curved between the third portion p3 and the fourth portion p4 to integrally and continuously connect these portions p3 and p4 to each other. The source electrode 12 of the semiconductor chip 10 is electrically connected to the second conductive member 22 via the first connector 51 and the second connecting member 42. That is, the second conductive member 22 functions as an outer lead connected to the source electrode 12.

The first connector 51 is opposed to the second face F2 of the semiconductor chip 10 and electrically connects the source electrode 12 and the second conductive member 22 to each other. The first connector 51 includes first portions p1, a middle portion mp1, and a second portion p2. The first portions p1 are opposed to the third portions p3 of the second conductive member 22, respectively, and are electrically connected to the second conductive member 22 via the connecting member 42. The second portion p2 is opposed to the second face F2 of the semiconductor chip 10 and is electrically connected to the source electrode 12 via the connecting member 41. The middle portion mp1 is curved between the first portions p1 and the second portion p2 to integrally and continuously connect these portions p1 and p2 to each other. The middle portion mp1 is protruded in a Z-axis direction relative to the second portion p2 and the first portions p1. The first connector 51 functions as a connector that electrically connects the source electrode 12 of the semiconductor chip 10 and the second conductive member 22 to each other.

The connecting member 41 is provided between the second face F2 of the semiconductor chip 10 and the first connector 51. The connecting member 41 fixes the first connector 51 to the source electrode 12 on the second face F2 of the semiconductor chip 10 and electrically connects the first connector 51 to the source electrode 12. The connecting member 41 is made of a conductive material lower in the melting point than the semiconductor chip 10 and the first conductive member 21 similarly to the connecting members 42 and 43. For example, a conductive material such as solder is used as the connecting member 41.

The third conductive member 23 illustrated in FIG. 1C has a configuration similar to that of the second conductive member 22 and is electrically connected to the gate electrode 13 of the semiconductor chip 10. The cross section of the region of the third conductive member 23 can be same as that of FIG. 1A or 2. The third conductive member 23 is an outer lead spaced in the X direction or a Y direction from the semiconductor chip 10 and the first and second conductive members 21 and 22 and is a portion of the lead frame. The third conductive member 23 is opposed to the second connector 52 and is electrically connected thereto. For example, a conductive material such as copper is used as the third conductive member 23.

While being a separate body from the second conductive member 22 and being different therefrom in the size, the third conductive member 23 has a shape similar to that of the second conductive member 22 in a lateral view as viewed from the Y direction. Therefore, the third conductive member 23 also includes portions p3_3 and p4_3 corresponding to the third portions p3 and the fourth portions p4, respectively, similarly to the second conductive member 22. The portions p3_3 are at a location higher in the Z direction than the portions p4_3 and function as posts connecting with the second connector 52 via a connecting member. The portions p4_3 extend substantially in the X-axis direction from the portions p3_3 and serve as external terminals to be connected to outside, respectively. There is a middle portion mp2_3 between each of the portions p3_3 and the associated portion p4_3. The middle portion mp2_3 is curved between the portion p3_3 and the portion p4_3 to integrally and continuously connect these portions to each other. The gate electrode 13 of the semiconductor chip 10 is electrically connected to the third conductive member 23 via the second connector 52 and the connecting member. That is, the third conductive member 23 functions as an outer lead connected to the gate electrode 13.

While being a separate body from the first connector 51 and being different therefrom in the size, the second connector 52 has a shape similar to that of the first connector 51 in a lateral view as viewed from the Y direction. Therefore, the second connector 52 also includes portions p1_3 and p2_3 and a middle portion mp1_3 corresponding to the first portions p1, the second portion p2, and the middle portion mp1, respectively, similarly to the first connector 51.

The second connector 52 is opposed to the second face F2 of the semiconductor chip 10 and electrically connects the gate electrode 13 and the third conductive member 23 to each other. The portions p1_3 are opposed to the portions p3_3 of the third conductive member 23, respectively, and are electrically connected to the third conductive member 23 via a connecting member (for example, solder). The portion p2_3 is opposed to the second face F2 of the semiconductor chip 10 and is electrically connected to the gate electrode 13 via a connecting member (44 in FIG. 3). The middle portion mp1_3 is curved between the portions p1_3 and the portion p2_3 to integrally and continuously connect these portions to each other. The middle portion mp1_3 is protruded in the Z-axis direction relative to the portion p2_3 and the portions p1_3. The second connector 52 functions as a connector that electrically connects the gate electrode 13 of the semiconductor chip 10 and the third conductive member 23 to each other.

A connecting member (45 in FIGS. 3 and 6) is provided between the third conductive member 23 and the second connector 52. The connecting member 45 fixes the second connector 52 to the third conductive member 23 and electrically connects the second connector 52 to the third conductive member 23. The same conductive material (for example, solder) as the connecting member 43 is used for this connecting member.

The resin part 30 coats the entire structure provided on the first and second conductive members 21 and 22 and seals the structure. For example, an insulating material such as resin is used as the resin part 30. Meanwhile, the portions p6 of the first conductive member 21, the portions p4 of the second conductive member 22, and the portions p4_3 of the third conductive member 23 are exposed from the resin part 30. Accordingly, the portions p4, p4_3, and p6 function as a lead region to be electrically connected to outside.

As described above, the first conductive member 21 is electrically connected to the drain electrode 11. The second conductive member 22 is electrically connected to the source electrode 12 via the first connector 51. The third conductive member 23 is electrically connected to the gate electrode 13 via the second connector 52.

For example, a metal such as Cu is used as the conductive members 21 to 23 and the connectors 51 and 52. For example, solder is used as the connecting members 41 to 45. For example, an epoxy resin is provided in the resin part 30. The resin part 30 may contain a filler.

The semiconductor device 100 may be, for example, an SOP (small outline package) type semiconductor device.

Figure 2:
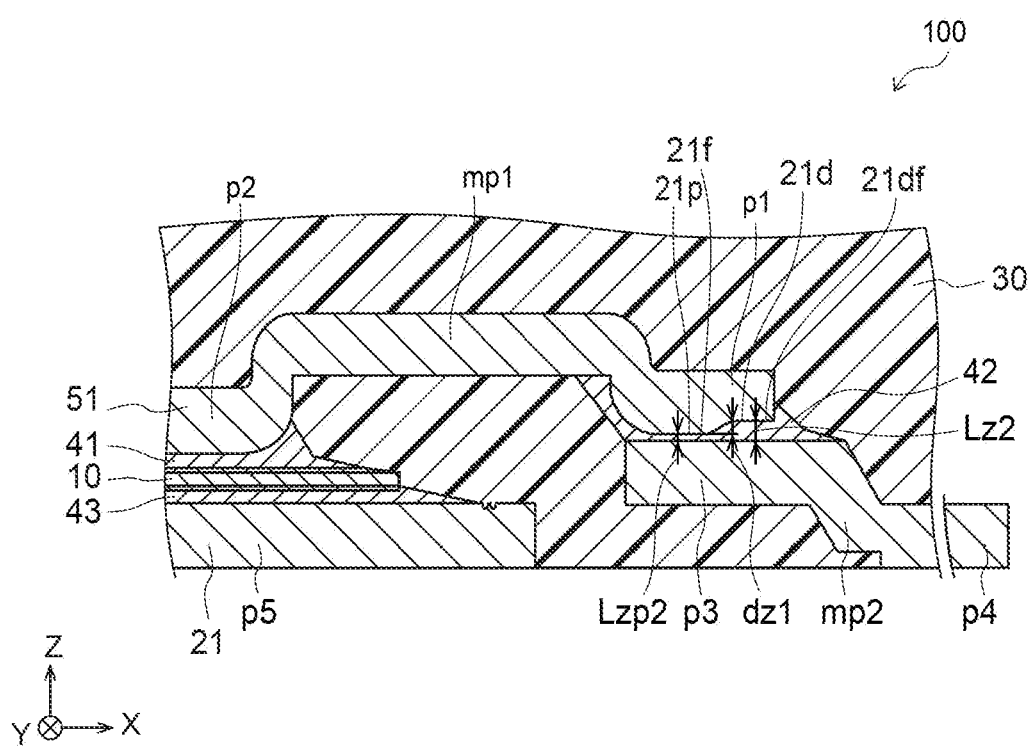
FIG. 2 is a sectional view enlargedly illustrating a portion PA in FIG. 1B.

FIG. 2 is a sectional view enlargedly illustrating a portion PA in FIG. 1B. The middle portion mp1 of the first connector 51 is at a location higher than the second portion p2 and the first portion p1. The location of the first position p1 in the Z-axis direction is between the location of the connecting member 42 and the location of the middle portion mp1. The location of the second portion p2 in the Z-axis direction is between the location of the connecting member 41 and the location of the middle portion mp1.

The first portion p1 of the first connector 51 has a face 21f opposed to the connecting member 42. The face 21f includes a depressed portion 21d and a projected portion 21p.

The portion p1 of the first connector 51 is located above the third portions p3 of the second conductive member 22. The height location of the depressed portion 21d in the Z direction is higher than that of the projected portion 21p. The bottom face of the depressed portion 21d is raised in the Z direction relative to the projected portion 21p and is recessed in the +Z direction.

The depressed portion 21d is located at an end of each of the portions p1. The depressed portion 21d has a bottom portion 21df. At least a part of the bottom portion 21df extends in the X or Y direction.

The projected portion 21p is positioned between the depressed portion 21d and the portion p2 in the X direction.

The distance between each of the portions p1 and the associated portion p3 in the depressed portion 21d is larger than that in the projected portion 21p. For example, the distance between the depressed portion 21d and the associated portion p3 along the Z-axis direction is assumed as a distance Lz2. The distance between the projected portion 21p and the associated portion p3 along the Z-axis direction is assumed as a distance Lzp2. In this case, the distance Lz2 is longer than the distance Lzp2 by a distance dz1.

Therefore, the thickness (corresponding to the distance Lz2) of the connecting member 42 located between the portion p3 and the depressed portion 21d is larger by the distance dz1 than the thickness (corresponding to the distance Lzp2) of the connecting member 42 located between the portion p3 and the projected portion 21p. As a result, this leads to suppression in cracking or detachment of the connecting member 42.

Figure 3:
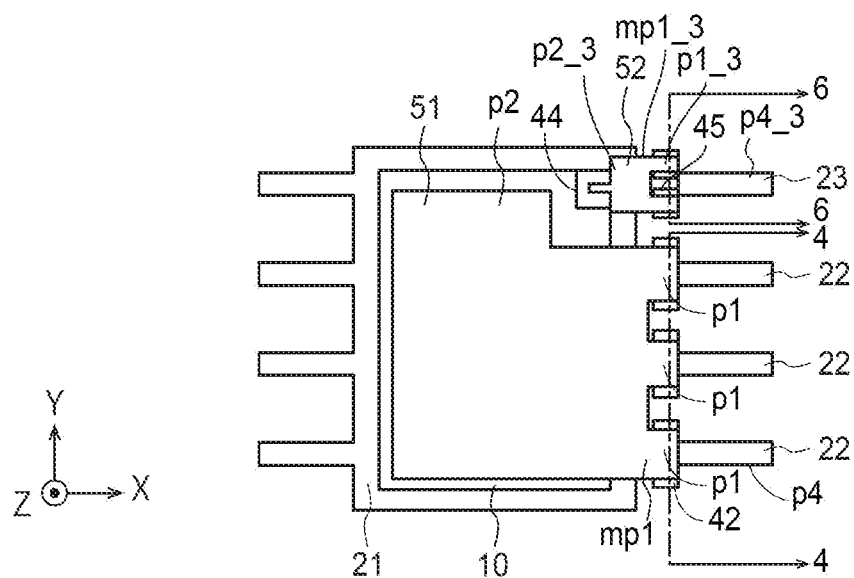
FIG. 3 is a schematic plan view illustrating a configuration example of the semiconductor device according to the first embodiment.
Figure 4:
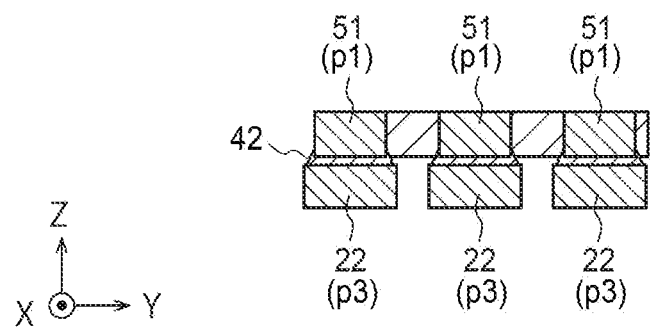
FIG. 4 is a schematic sectional view illustrating the configuration example of the semiconductor device according to the first embodiment.

FIG. 3 is a schematic plan view illustrating a configuration example of the semiconductor device 100 according to the first embodiment. FIG. 4 is a schematic sectional view illustrating the configuration example of the semiconductor device 100 according to the first embodiment. FIG. 4 corresponds to a cross section along a line 4-4 in FIG. 3. FIGS. 3 and 4 illustrate the semiconductor device 100 illustrated in FIG. 1C and the like in a simplified manner for convenience sake.

In the present embodiment, as illustrated in FIG. 3, the portions p1 of the first connector 51 serving as the source connector are an example of a plurality of first protruded portions and are protruded in the +X direction from the portion p2 and the middle portion mp1. That is, the portions p1 are protruded in a comb manner in a direction from the first conductive member 21 to the second conductive member 22. The portions p1 are provided to correspond to the portions p3 or p4 of the second conductive member 22, respectively. Therefore, the number of the portions p1 is equal to that of the portions p3 or p4. However, the number of the portions p1 may be different from that of the portions p3 or p4.

The portions p3 of the second conductive member 22 are an example of third protruded portions and are protruded in the −X direction from the portions p4 or the middle portions mpg. The portions p3 are provided to correspond to the portions p1, respectively.

As illustrated in FIG. 4, the connecting member 42 is provided between each of the portions p1 of the first connector 51 and the associated one of the portions p3 of the second conductive member 22. The connecting members 42 are provided to correspond to places between the portions p1 and the associated portions p3, respectively. The connecting member 42 between a certain one of the portions p1 and the associated one of the portions p3 is separated from the connecting members 42 between the other portions p1 and the other portions p3.

The portions p1 are physically separated from each other in a region in which the connecting members 42 are respectively provided. The portions p3 are also physically separated from each other in a region in which the connecting members 42 are respectively provided. However, as illustrated in FIG. 3, the portions p1 constitute the first connector 51 integrally with the portion p2 and the middle portion mp1. Therefore, the portions p1 are electrically connected to each other. Although not illustrated, the portions p3 also can constitute the second conductive member 22 integrally with the portions p4. Therefore, the portions p3 are also electrically connected to each other.

Figure 5:
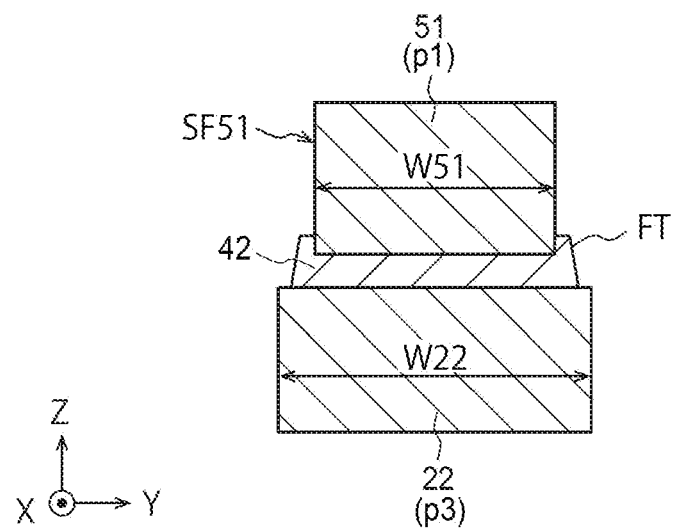
FIG. 5 is a schematic sectional view illustrating a configuration example of one portion p1, and a portion p3 and a connecting member corresponding to this portion p1.

FIG. 5 is a schematic sectional view illustrating a configuration example of one portion p1, and a portion p3 and a connecting member 42 corresponding to this portion p1. In the present embodiment, a first width W51 of a face of the portion p1 as the first protruded portion opposed to the portion p3 as the third protruded portion is smaller than a second width W22 of a face of the portion p3 opposed to the portion p1 in a cross section perpendicular to the X direction. In a plan view as viewed from the Z direction, the portion p1 overlaps with the portion p3 and the portion p3 is as viewed on both sides of the portion p1. Accordingly, the connecting member 42 (for example, solder) climbs up on a lower portion of a side face SF51 from the bottom face of the portion p1 to coat the lower portion in the reflow process. That is, a fillet FT of the connecting member 42 slightly climbs up along the side face SF51 of the portion p1 due to surface tension. Preferably, the center line of the portion p1 and the center line of the portion p3 are almost aligned with each other or close to each other. That is, it is preferable that the first connector 51, the second conductive member 22, and the connecting member 42 be bilaterally symmetric in the Y direction. Accordingly, the fillet FT of the connecting member 42 is formed substantially uniformly on the side face SF51 on both sides of the portion p1.

As described above, according to the present embodiment, the first connector 51 being the source connector has the portions p1 protruded in the +X direction from the portion p2 located on the semiconductor chip 10. The second conductive member 22 being the source outer lead has the portions p3 protruded in the -X direction from the portions p4, respectively. The connecting members 42 (for example, solder) are provided between the portions p1 and the portions p3 corresponding to each other, respectively. The connecting members 42 are separated from each other between the portions p1 and the portions p3 as illustrated in FIG. 4. Therefore, when the connecting members 42 are reflowed by thermal treatment, the portions p1 are positioned near the centers of the associated portions p3 due to surface tension of the connecting members 42, respectively, as illustrated in FIG. 4 and are less likely to be displaced (less likely to rotate) in the Y direction. Furthermore, the connecting members 42 climb up on the side faces SF51 of the associated portions p1 due to surface tension of the connecting members 42 to form the fillets FT, respectively. Accordingly, the portions p1 are even less likely to be displaced (less likely to rotate) in the Y direction from the associated portions p3, respectively. The connecting members 41 and 43 are also reflowed at the same time by this reflow process. Since the portions p1 of the first connector 51 are substantially positioned to the portions p3 of the second conductive member 22, respectively, the first connector 51 is less likely to be displaced also from the semiconductor chip 10 and the first conductive member 21. As a result, the present embodiment can suppress relative positional misalignment of the semiconductor chip 10, the conductive members 21 and 22, and the connector 51.

Figure 6:
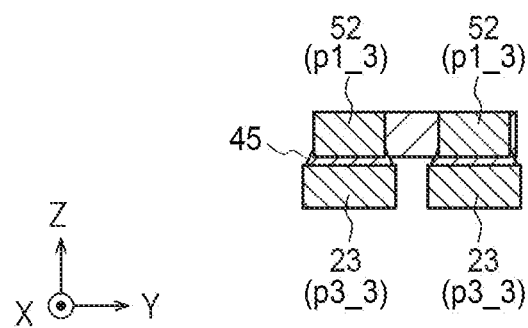
FIG. 6 is a schematic sectional view illustrating a configuration example of the second connector according to the first embodiment.

FIG. 6 is a schematic sectional view illustrating a configuration example of the second connector 52 according to the first embodiment. FIG. 6 corresponds to a cross section along a line 6-6 in FIG. 3. FIG. 6 also illustrates the semiconductor device 100 illustrated in FIG. 1C and the like in a simplified manner for convenience sake.

In the present embodiment, the gate side has the same configuration as that of the source side. The portions p1_3 of the second connector 52 serving as a gate connector are an example of the first protruded portions and are protruded in the +X direction from the portion p2_3 and the middle portion mp1_3 as illustrated in FIG. 3. That is, the portions p1_3 are protruded in a comb manner in a direction from the first conductive member 21 to the third conductive member 23. As illustrated in FIG. 6, the portions p1_3 correspond to the portions p3_3 of the third conductive member 23, respectively. The number of the portions p1_3 is equal to that of the portions p3_3. However, the number of the portions p1_3 may be different from that of the portions p3_3.

The portions p3_3 of the third conductive member 23 are an example of the third protruded portions and are protruded in the -X direction from the portions p4_3 or the middle portions mp1_3. The portions p3_3 are provided to correspond to the portions p1_3, respectively.

As illustrated in FIG. 6, the connecting member 45 is provided between each of the portions p1_3 of the second connector 52 and the associated one of the portions p3_3 of the third conductive member 23. The connecting members 45 are provided to correspond to the portions p1_3 and the associated portions p3_3, respectively. The connecting member 45 between a certain one of the portions p1_3 and the associated one of the portions p3_3 is separated from the connecting members 45 between the other portions p1_3 and the other portions p3_3.

The portions p1_3 are physically separated from each other in a region in which the connecting members 45 are respectively provided. The portions p3_3 in FIG. 6 are also physically separated from each other in a region in which the connecting members 45 are respectively provided. However, as illustrated in FIG. 3, the portions p1_3 constitute the second connector 52 integrally with the portion p2_3 and the middle portion mp1_3. Therefore, the portions p1_3 are electrically connected to each other. The portions p3_3 also constitute the third conductive member 23 integrally with the portions p4_3. Therefore, the portions p3_3 are also electrically connected to each other.

Figure 7:
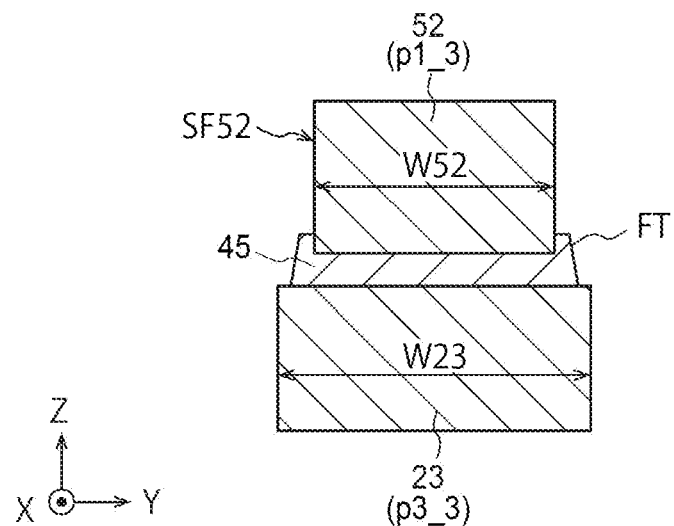
FIG. 7 is a schematic sectional view illustrating a configuration example of one portion p1_3, and a portion p3_3 and a connecting member corresponding to this portion p1_3.

FIG. 7 is a schematic sectional view illustrating a configuration example of one portion p1_3, and a portion p3_3 and a connecting member 45 corresponding to this portion p1_3. In a cross section perpendicular to the X direction, a third width W52 of a face of the portion p1_3 as the second protruded portion opposed to the portion p3_3 as a fourth protruded portion is smaller than a fourth width W23 of a face of the portion p3_3 opposed to the portion p1_3. In a plan view as viewed from the Z direction, the portion p1_3 overlaps with the portion p3_3 and the portion p3_3 is as viewed on both sides of the portion p1_3. Accordingly, the connecting member 45 (for example, solder) climbs up on a lower portion of a side face SF52 from the bottom face of the portion p1_3 to coat the lower portion in the reflow process. That is, a fillet FT of the connecting member 45 slightly climbs up along the side face SF52 of the portion p1_3 due to surface tension. Preferably, the center line of the portion p1_3 and the center line of the portion p3_3 are almost aligned with each other or close to each other. That is, it is preferable that the second connector 52, the third conductive member 23, and the connecting member 45 be bilaterally symmetric in the Y direction. Accordingly, the fillet FT of the connecting member 45 is formed substantially uniformly on the side face SF52 on both sides of the portion p1_3.

As described above, according to the present embodiment, the second connector 52 being the gate connector has the portions p1_3 protruded in the +X direction from the portion p2_3 located on the semiconductor chip 10. The third conductive member 23 being the gate outer lead has the portions p3_3 protruded in the −X direction from the portions p4_3, respectively. The connecting members 45 (for example, solder) are provided between the portions p1_3 and the portions p3_3 corresponding to each other, respectively. The connecting members 45 are separated from each other between the portions p1_3 and the portions p3_3 as illustrated in FIG. 6. Therefore, when the connecting members 45 are reflowed by thermal treatment, the portions p1_3 are positioned near the centers of the associated portions p3_3 due to surface tension of the connecting members 45, respectively, as illustrated in FIG. 6 and are less likely to be displaced (less likely to rotate) in the Y direction. Furthermore, the connecting members 45 climb up on the side faces SF52 of the associated portions p1_3 due to surface tension of the connecting members 45 to form the fillets FT, respectively. Accordingly, the portions p1_3 are even less likely to be displaced (less likely to rotate) in the Y direction from the associated portions p3_3, respectively. The connecting members 44 are also reflowed at the same time by this reflow process. Since the portions p1_3 of the second connector 52 are substantially positioned to the portions p3_3 of the third conductive member 23, respectively, the second connector 52 is less likely to be displaced also from the semiconductor chip 10 and the first conductive member 21.

If the portions p1 are not protruded and are continuous to each other or if the portions p1_3 are not protruded and are continuous to each other, the locations of the connectors 51 and 52 are likely to be displaced in the reflow process for solder or the like, and there is a risk of a decrease in the reliability or a short circuit failure.

In contrast thereto, in the semiconductor device 100 according to the present embodiment, the portions p1 are protruded and are separated from each other. The portions p1_3 are protruded and are separated from each other. As a result, the present embodiment can also suppress relative displacement of the semiconductor chip 10, the conductive member 23 being the gate outer lead, and the connector 52 being the gate connector. Therefore, the locations of the connectors 51 and 52 are less likely to be displaced in the reflow process for the connecting members 41 to 45, which leads to improvement in the reliability and suppression of short circuit.

Second Embodiment

Figure 8:
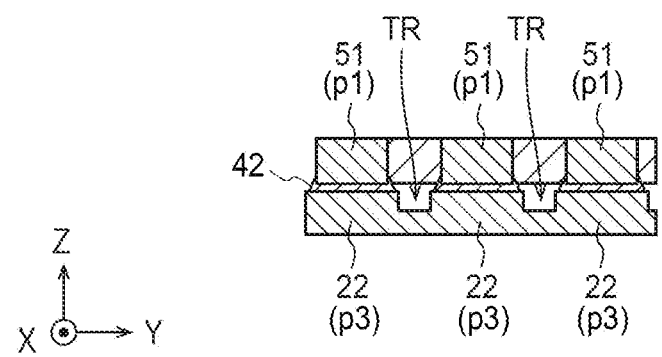
FIG. 8 is a sectional view illustrating a configuration example of the semiconductor device according to a second embodiment.

FIG. 8 is a sectional view illustrating a configuration example of the semiconductor device 100 according to a second embodiment. FIG. 8 illustrates a cross section of a source region corresponding to FIG. 4 of the first embodiment. In the second embodiment, the portions p3 of the second conductive member 22 are connected to each other at the bottom portions while separated at the upper portions by trenches TR. That is, the portions p3 are formed as first regions (mesa regions) separated by the trenches TR. The trenches TR can be formed by half etching of the conductive member 22. While the portions p3 are not separated entirely in the Z direction as described above, the connecting members 42 are provided between the portions p1 and the portions p3, respectively, and are separated similarly to those in the first embodiment. The connecting members 42 are not provided in the trenches TR.

Figure 9:
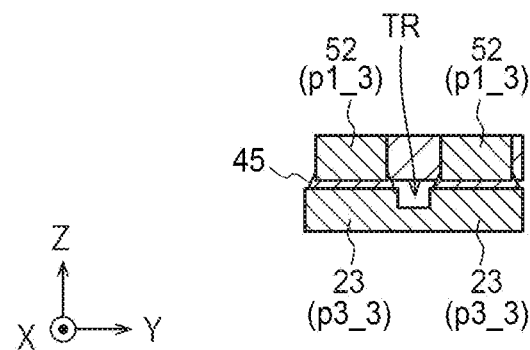
FIG. 9 is a sectional view illustrating a configuration example of the semiconductor device according to the second embodiment.

FIG. 9 is a sectional view illustrating a configuration example of the semiconductor device 100 according to the second embodiment. FIG. 9 illustrates a cross section of a gate region corresponding to FIG. 6 of the first embodiment. In the second embodiment, while separated at the upper portions by trenches TR, the portions p3_3 of the third conductive member 23 are connected to each other at the bottom portions. That is, the portions p3_3 are formed as second regions (mesa regions) separated by the trenches TR. While the portions p3_3 are not separated entirely in the Z direction as described above, the fourth connecting members 45 are provided between the portions p1_3 and the portions p3_3, respectively, and are separated similarly to those in the first embodiment. The connecting members 45 are not provided in the trenches TR.

The rest of the configuration of the second embodiment can be same as the corresponding configuration of the first embodiment. Accordingly, the second embodiment can obtain effects identical to those of the first embodiment.

Third Embodiment

Figure 10:
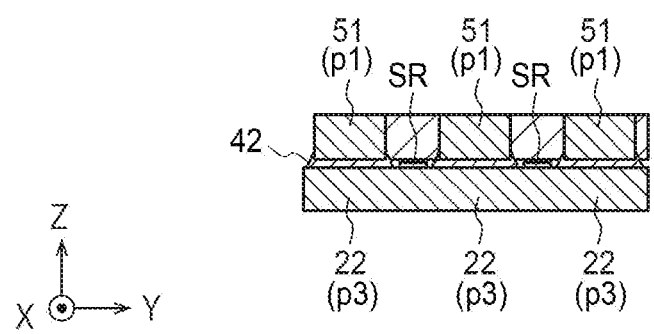
FIG. 10 is a sectional view illustrating a configuration example of the semiconductor device according to a third embodiment.

FIG. 10 is a sectional view illustrating a configuration example of the semiconductor device 100 according to a third embodiment. FIG. 10 illustrates a cross section of a source region corresponding to FIG. 4 of the first embodiment. In the third embodiment, the second conductive member 22 is not separated into the portions p3 and is continuous as a whole. That is, the surface of the second conductive member 22 is formed to be substantially flat. In this case, it suffices that the connecting members 42 can maintain the separated state on the portions p1 in the reflow process. For example, solder resist SR may be applied onto portions of the surface of the second conductive member 22 between the portions p1. This enables the connecting members 42 to be provided only under the portions p1 without being formed on the solder resist SR. That is, the connecting members 42 are selectively provided between the portions p1 of the first connector 51 and the second conductive member 22, respectively, and are in a state separated from each other.

Figure 11:
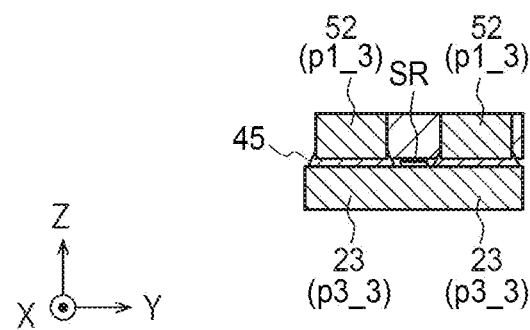
FIG. 11 is a sectional view illustrating a configuration example of the semiconductor device according to the third embodiment.

FIG. 11 is a sectional view illustrating a configuration example of the semiconductor device 100 according to the third embodiment. FIG. 11 illustrates a cross section of a gate region corresponding to FIG. 6 of the first embodiment. In the third embodiment, the third conductive member 23 is not separated into the portions p3_3 and is continuous as a whole. That is, the surface of the third conductive member 23 is formed to be substantially flat. In this case, it suffices that the connecting members 45 can maintain the separated state on the portions p1_3 in the reflow process. For example, solder resist SR may be applied onto portions of the surface of the third conductive member 23 between the portions p1_3. This enables the connecting members 45 to be provided only under the portions p1_3 without being formed on the solder resist SR. That is, the connecting members 45 are selectively provided between the portions p1_3 of the second connector 52 and the third conductive member 23, respectively, and are in a state separated from each other.

The rest of the configuration of the third embodiment can be same as the corresponding configuration of the first embodiment. As described above, it suffices that the connecting members 42 and 45 can maintain the separated states on the portions p1 and p1_3, respectively, in the reflow process. Accordingly, the third embodiment can obtain effects identical to those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor chip comprising a first face, and a second face on an opposite side of the semiconductor chip to the first face;
a first conductive member opposed to a first electrode on the first face of the semiconductor chip and electrically connected thereto;
a second conductive member spaced from the semiconductor chip and the first conductive member;
a third conductive member spaced from the semiconductor chip and the first and second conductive members;
a first connector opposed to a second electrode on the second face of the semiconductor chip and electrically connecting the second electrode and the second conductive member to each other;
a second connector opposed to a third electrode on the second face of the semiconductor chip and electrically connecting the third electrode and the third conductive member to each other;
a first connecting member connecting the first connector and the second face of the semiconductor chip to each other; and
a second connecting member connecting the first connector and the second conductive member to each other, wherein
the first connector comprises a plurality of first protruded portions protruded in a first direction from the first conductive member toward the second conductive member, the first protruded portions being arranged in a third direction perpendicular to the first direction, the third direction being in a plane parallel to the first face,
portions of the second connecting member are provided respectively corresponding to the first protruded portions, and are respectively placed between the first protruded portions and the second conductive member, and
the portions of the second connecting member, which are respectively corresponding to the first protruded portions, are separated from each other.

2. The device of claim 1, further comprising:
a third connecting member connecting the second connector and the second face of the semiconductor chip to each other; and
a fourth connecting member connecting the second connector and the third conductive member to each other, wherein
the second connector comprises a plurality of second protruded portions protruded in a second direction from the first conductive member toward the third conductive member, and
the fourth connecting member is provided to correspond to each of places between the second protruded portions and the third conductive member.

3. The device of claim 2, wherein portions of the fourth connecting member, which are respectively corresponding to the second protruded portions, are separated from each other.

4. The device of claim 2, wherein
the third conductive member comprises a plurality of fourth protruded portions protruded in an opposite direction to the second direction and respectively corresponding to the second protruded portions, and
the fourth connecting member is provided between the second protruded portions and the fourth protruded portions.

5. The device of claim 4, wherein a third width of a face of each of the second protruded portions opposed to an associated one of the fourth protruded portions is smaller than a fourth width of a face of the fourth protruded portion opposed to the second protruded portion in a cross section perpendicular to the second direction.

6. The device of claim 2, wherein
the third conductive member comprises second trenches between a plurality of second regions, the plurality of second regions corresponding to the second protruded portions, respectively, and
the fourth connecting member is provided between the second protruded portions and the second regions and is not provided in the second trenches.

7. The device of claim 2, wherein the fourth connecting member coats lower portions of side faces of the second protruded portions, starting from bottom edges of the second protruded portions.

8. The device of claim 1, wherein
the second conductive member comprises a plurality of third protruded portions protruded in an opposite direction to the first direction and respectively corresponding to the first protruded portions, and
the second connecting member is provided between the first protruded portions and the third protruded portions.

9. The device of claim 8, wherein a first width of a face of each of the first protruded portions opposed to an associated one of the third protruded portions is smaller than a second width of a face of the third protruded portion opposed to the first protruded portion in a cross section perpendicular to the first direction.

10. The device of claim 8, wherein
each of the first protruded portions comprises a first width in the third direction,
each of the third protruded portions comprises a second width in the third direction, and
the first width is smaller than the second width.

11. The device of claim 10, wherein
the second connector comprises a plurality of second protruded portions protruded in a second direction from the first conductive member toward the third conductive member,
each of the second protruded portions comprises a third width in a fourth direction perpendicular to the second direction,
each of the third protruded portions comprises a fourth width in the fourth direction, and
the third width is smaller than the fourth width.

12. The device of claim 10, wherein the first connector and the second connector are arranged in the third direction.

13. The device of claim 1, wherein
the second conductive member comprises first trenches between a plurality of first regions, the plurality of first regions corresponding to the first protruded portions, respectively, and
the second connecting member is provided between the first protruded portions and the first regions and is not provided in the first trenches.

14. The device of claim 1, wherein the second connecting member coats lower portions of side faces of the first protruded portions, starting from bottom edges of the first protruded portions.

15. The device of claim 1, wherein the first electrode is a source, the second electrode is a drain, and the third electrode is a gate.

16. The device of claim 1, wherein the first connector and the second connector are arranged in the third direction.

\* \* \* \* \*